United States Patent [19]

Eaton, Jr. et al.

[11] 4,296,480
[45] Oct. 20, 1981

[54] REFRESH COUNTER

[75] Inventors: Sargent S. Eaton, Jr.; Paul R. Schroeder, both of Colorado Springs, Colo.

[73] Assignee: Mostek Corporation, Carrollton, Tex.

[21] Appl. No.: 66,149

[22] Filed: Aug. 13, 1979

[51] Int. Cl.³ .............................................. G11C 11/40
[52] U.S. Cl. ...................................................... 365/222
[58] Field of Search ........................... 365/222; 307/238

[56] References Cited

U.S. PATENT DOCUMENTS

| | | | |
|---|---|---|---|
| 3,796,998 | 3/1974 | Appelt | 365/222 |
| 3,806,898 | 4/1974 | Askin | 365/222 |
| 3,858,185 | 12/1974 | Reed | 365/222 |
| 4,028,557 | 6/1977 | Wilson | 365/222 |
| 4,079,462 | 3/1978 | Koo | 365/222 |

*Primary Examiner*—Terrell W. Fears

[57] ABSTRACT

A refresh counter which uses existing address buffers and is implemented with refresh address storage and decoders. The address buffers act to multiplex the refresh address storage outputs as inverted outputs when properly enabled. When all lower order bits are true at a particular unit of the refresh counter and a transfer clock signal occurs, the outputs of the buffer are transferred to the refresh storage where the buffer multiplexes them when enabled. The clocking scheme is structured to enable only at the end of a refresh cycle. In this manner, the counter is incremented at the end of each refresh cycle.

16 Claims, 4 Drawing Figures

REFRESH COUNTER

BACKGROUND OF THE INVENTION

1. Field of the Invention

This invention relates to dynamic random access memories, and more particularly, to refresh counters.

2. Description of the Prior Art

Static random access memories have always been popular because of their ease of use. Dynamic random access memories, however, offer lower costs primarily because of the smaller chip area required. One of the design goals in constructing a dynamic random access memory is to maintain the internal efficiency of a dynamic RAM, while making the part look static from an external point of view. However, static RAMs require no refresh and an external refresh for a dynamic RAM would not satisfy the design objective. Therefore it is highly desirable to reduce the difficulty of refresh by including as much of the refresh circuitry as possible on chip.

Possible methods of achieving this include a separate refresh counter in the memory to keep track of refresh addresses. In this manner the counter could be incremented at the end of each refresh cycle. A further method would be the inclusion of a shift register or ring counter which would cycle through each of the word lines in a succession. However, this method, just as the first method, would require a considerable amount of additional circuitry and additional chip area. This additional area to make the part look static only serves to decrease the price gap between static and dynamic memories.

SUMMARY OF THE INVENTION

The present invention permits a refresh counter on chip by taking maximum advantage of existing circuitry, that is, using parts already existing as part of the dynamic random access memory. The address buffers, already necessary to create high level true and complement address signals from input signals, are used as a part of the counter function. The inputs to each address buffer are multiplexed as either internal refresh addresses or external addresses supplied by the user, according to an enable signal. In the preferred embodiment, when all lower order bits are true and the transfer clock signal occurs, the outputs of each buffer are transferred to the refresh storage nodes for inversion by the buffer. The transfer clock signal is designed to occur only at the end of a refresh cycle and effectively inverts the data in selected refresh storage nodes. In this manner, the counter is incremented at the end of each refresh cycle.

The additional circuitry required to implement the entire refresh function in minimal using this method, since only a few transistors need to be added to each address buffer. Although one extra decoder per buffer is required, the number of extra decoders is small compared to the large number of decoders already needed for selecting word lines. It is possible, then, to use this method for refresh control, and to implement the entire refresh function on chip, with only a few additional transistors.

DESCRIPTION OF THE PREFERRED EMBODIMENTS

Figure 1:
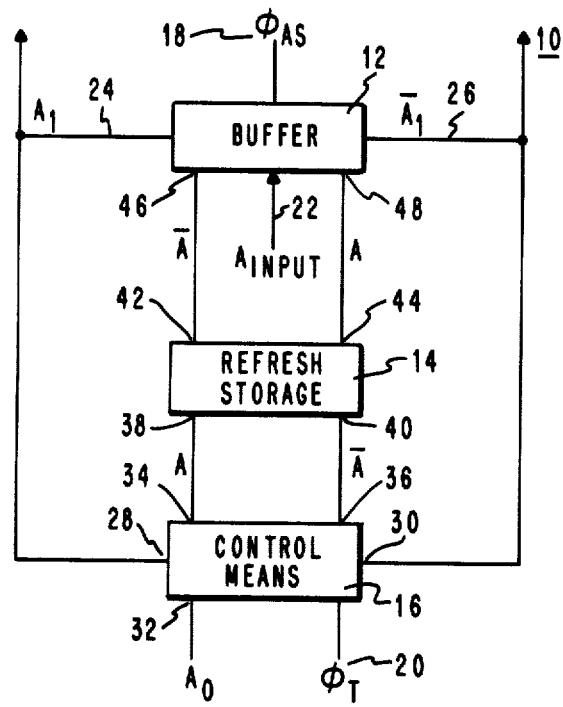
FIG. 1 is a block diagram of a single unit of the refresh counter, operating on a single address buffer.

Referring to FIG. 1, a block diagram of the refresh counter unit 10 can be seen. The address buffer for a single address bit is indicated at 12. Refresh storage is shown as 14 and control means as 16. Also the address strobe is labeled 18 and a transfer clock signal is labeled 20. The address buffer 12 receives an address bit 22 at a normal TTL level. High level true and complement representations are generated at 24 and 26 respectively. The control means 16 reads the high level true and complement representations 24 and 26, at 28 and 30 respectively.

In the preferred embodiment, the control means 16 also receives the next lower order address bit at 32. Depending on the order of the address buffer 12 and its address bit input 22, there may be any number of inputs at the control means input 32 equal to one less than the order of the address input 22. In FIG. 1, there is a single lower order address input at 32.

The counter in the preferred embodiment operates on the realization that a binary counter can be implemented by inverting the ith bit whenever the input bits 32 are all 1's. For example, in a third order binary number, the following count would exist:

| $A_2$ | $A_1$ | 0 |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

In this table it can be noted that the second bit, $A_1$, changes whenever the first bit, $A_0$, goes from 1 to 0. It can further be noted that the third bit, $A_2$, changes whenever the first and second bits, $A_0$ and $A_1$, change from 11 to 00. Thus, whenever the lower order bits become true levels (1), the next highest order bit will change on the next clock signal 20.

Therefore in the block diagram shown in FIG. 1, when the $A_0$ bit reads 1, and the transfer signal 20 is true, the control means 16 transfers the input 28 to the output 34 and the input 30 to the output 36. Refresh storage 14 then reads the outputs 34 and 36 at 38 and 40, respectively, and stores these signals at outputs 42 and 44. Note, however, that the outputs 42 and 44 for the refresh storage 14 are entered into the buffer 12 at 46 and 48 and inverted as outputs 24 and 26. That is, input 46 will be multiplexed by the address buffer and inverted as output 24 and input 48 will be multiplexed and inverted through the address buffer 12 as output 26. This will occur upon the true level of the address strobe 18. Another clock signal, not shown, indicates to the address buffer when to read the address input 22. In effect, then, the outputs 24 and 26 of the address buffer 12 are inverted when the control means 16 reads transfer clock 20 and address inputs 32 as all true inputs. In this manner, the next highest order bit from those read at inputs 32 has been counted up.

Figure 2:
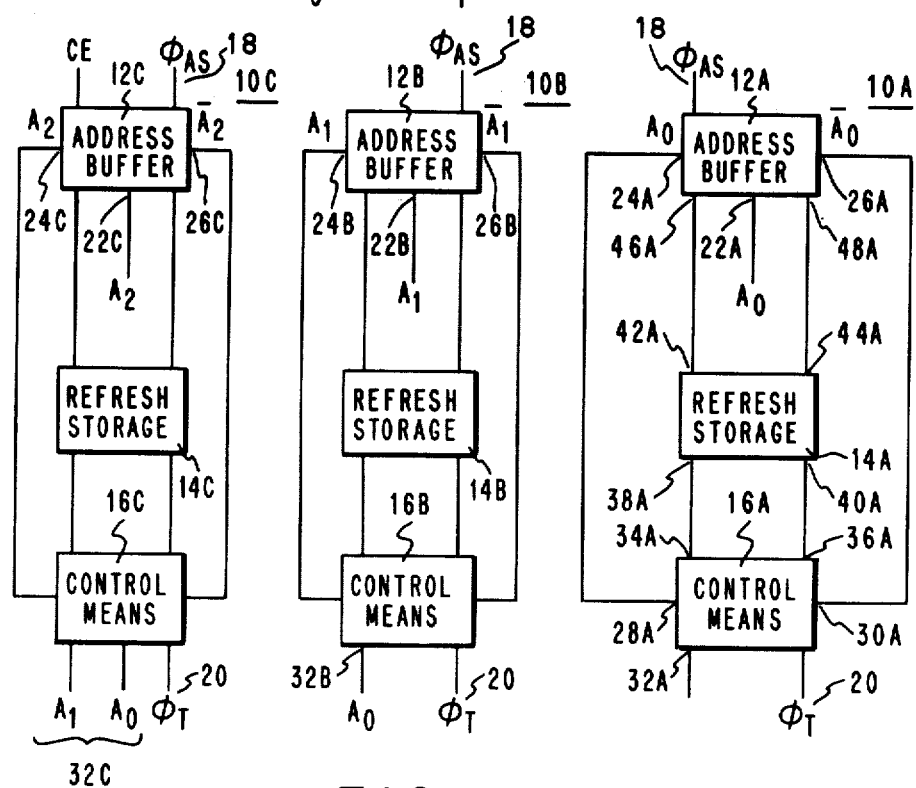
FIG. 2 shows an expanded block diagram illustrating the counting function for a third order binary numeral system.

An example of a third order counter may be seen in FIG. 2. Initially, the address buffers 12A, 12B and 12C will read at 22A, 22B and 22C the initial address "000". The address buffers 12A, 12B and 12C will then produce high level true and complement representations at 24A and 26A, 24B and 26B, and 24C and 26C. Note at this point that the control means 16A receives only the transfer clock signal 20. Thus, each time the transfer clock signal 20 goes high, the control means 16A is enabled. The other control means 16B and 16C receive inputs $A_0$ at 32B and input $A_0$ and $A_1$ at 32C. As these address bits are at 0 at this point, the control means 16B and 16C cannot be enabled by the transfer clock signal 20.

At the initial moment of reading, then, the control means 16A is reading "0" at 28A, and "1" at 30A. Upon the occurrence of the enabling transfer clock signal 20, the "0" at 28A is transferred control means output 34A to be read by the refresh storage 14A at input 38A. Similarly the "1" at 30A is transferred to output 36A to be read at refresh storage input 40A. The inputs 38A and 40A are stored for reading at outputs 42A and 44A. The address buffer 12A reads these at inputs 46A and 48A. Then the address buffer 12A, upon the occurrence of address strobe 18, reads the refresh storage outputs 42A and 44A at inputs 46A and 48A and supplies them as inverted outputs 24A and 26A, thereby inverting the previous outputs at the 24A and 26A.

The counter has now progressed to the second level "001" as shown in the above table. The input 32B now reads a "1" such that at the next occurrence of the transfer signal 20, the control means 16B can operate to invert the outputs 24B and 26B just as the address buffer 12A, the refresh storage 14A, and control means 16A have done, and will do each cycle. The first order bit unit 10A will invert the output 24A and 26A upon every occurrence of the transfer signal 20. Unit 10B will invert the output 24B and 26B only when the inputs 32B and 20 are true.

Returning to the example, we have now progressed to the third bit, "010", and unit 10c now reads a "0" and a "1" at control means inputs 32C. Thus control means 16C will not operate upon the occurrence of the next clock signal 20. Unit 10B and the control means 16B also read a "0" at the input 32B and will not operate. Therefore, on the next counting operation, only unit 10A will operate, inverting the address buffer outputs 24A and 26A the count will progress to "011".

At this point, the unit 10c now has all true inputs 32C and will operate to invert the outputs 24C and 26C upon the occurrence of the next transfer signal 20. Similarly the control means 16B reads a true level at 32B and will operate to invert the outputs 24B and 26B upon the occurrence of the next transfer signal 20. Thus, on the occurrence of the next transfer signal, all units invert their outputs to produce the binary number "100."

Following through the example, it can be seen that the next number will be "101," which will place the unit 10B in a position to invert its output so that the next numeral will be "110." At this point, neither unit 10B or 10C are enabled and the next count will progress to "111."

Finally, all units are enabled, and, upon the next transfer signal 20, the counter will move to "000" thus completing a full cycle for a third order binary number.

The preferred embodiment has illustrated a binary serial counter in the up direction. It should be recognized that the individual units could be arranged in such a manner and the control means gated in such a manner as to produce any counting arrangement, including at random or binary down. Further, any order n numbering system could be used, using the n address buffers already present to receive n address bits and generate logic level true and complement representations. A unit 10 would exist for each address bit, although, of course, a decoder 56, to be explained in the following paragraph, would not be required for the first order bit. Thus, only n-1 decoders would be required. Finally, the nth unit 10 would receive at least i address bits, where $i = 1, 2, 3, \ldots, n-1$.

Figure 3:
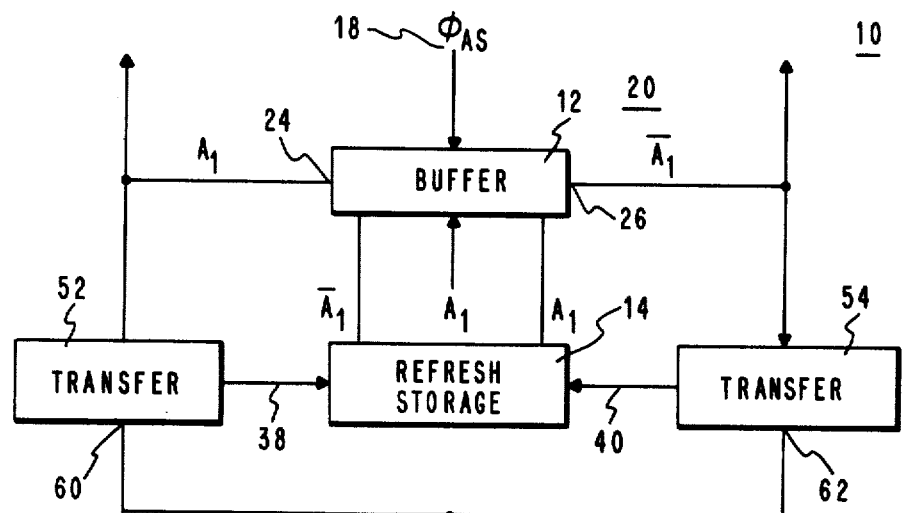
FIG. 3 is an expanded block diagram.

Referring now to FIG. 3, the unit 10 can be seen expanded into a more detailed block diagram. In this diagram, the unit 10 has its control means shown as two transfer devices 52 and 54 and a decoder 56. The decoder 56 receives the lower order bits at input 32 and the transfer clock signal 20. The decoder 56 then generates an output 58 when the input 32 and the clock signal 20 are true. Enabling output 58 is received at the transfer devices 52 and 54 at inputs 60 and 62 respectively. With the transfer devices enabled, the buffer outputs 24 and 26 are transferred through the transfer devices 52 and 54 to the refresh storage at inputs 38 and 40. The unit then operates as described above.

Figure 4:
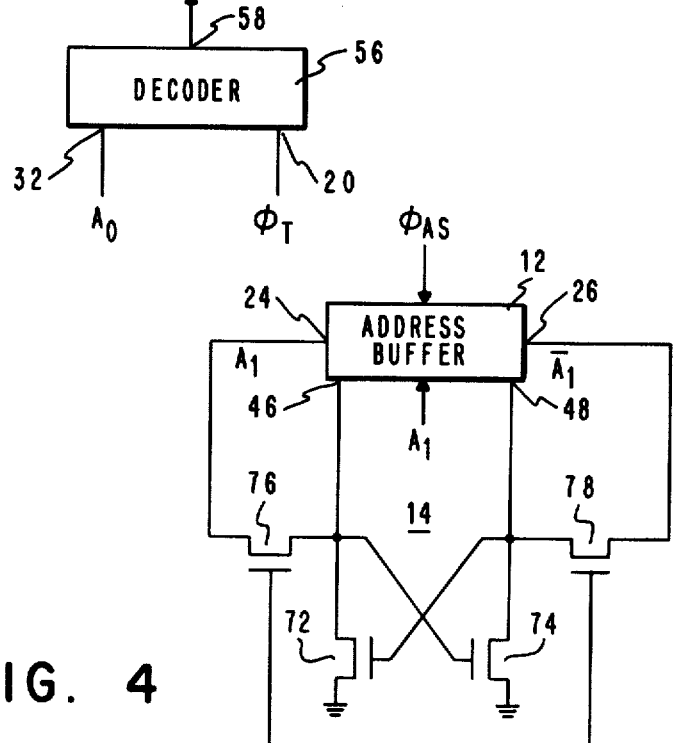
FIG. 4 is a schematic diagram of a single unit of refresh counter.

In FIG. 4, the refresh storage 14 is seen as a cross-coupled flip-flop 70 composed of two MOSFETs 72 and 74, with the gates at each MOSFET tied to the drain of the other MOSFET. The drains of the MOSFETs 72 and 74 are also tied to the inputs 46 and 48 of the address buffer 12. The sources of the MOSFETs 72 and 74 are grounded. The transfer devices 52 and 54 are shown as MOSFETs 76 and 78, with their sources connected to the drains of the MOSFETs 72 and 74, and their drains connected to the output of the bufer 12 at 24 and 26, respectively. The gates of the transfer devices, MOSFETs 76 and 78, are tied to the output of the decoder 56, which may be shown as an AND gate 80. The AND gate receives the transfer clock signal at 20 and the lower order bits, if any, at 32.

While the invention has been particularly shown and described with reference to preferred embodiments thereof, it will be understood by those skilled in the art that various changes in form and details may be made therein without departing from the spirit and scope of the invention.

What is claimed is:

1. An n-bit address refresh counter comprising:
   an address buffer for each address bit adapted to receive an address buffer strobe for inverting a pair of complementary input signals and placing the inverted signals onto a pair of output terminals;
   a refresh address storage circuit for each address buffer connected to the address buffers for storing and providing the pair of complementary input signals; and
   n−1 decoders for n−1 address buffers wherein the ith decoder receives a transfer clock signal and at least i address bits, where $i = 1, 2, \ldots, N-1$ and controls the transfer of the inverted signals on the pair of output terminals of the ith address buffer to an input of its corresponding refresh storage circuit.

2. An address refresh counter comprising:

a plurality of address buffers each for receiving one of the address bits and adapted to receive an address buffer strobe to sample the input of the address buffer and generate high level true and complement representation;

a refresh storage for each address buffer for storing the true and complement representations and means connected to each address buffer for receiving a transfer clock signal and selected address bits and for controlling the transfer of the inverted true and complement representations of the address buffer to its corresponding refresh storage.

3. The refresh counter of claim 2 wherein the selected address bits are all lower order address bits.

4. The refresh counter of claim 2 wherein the inverted true and complement representations of an address buffer are transferred when all of the selected address bits are true.

5. The refresh counter of claim 4 wherein the selected address bits are all lower order address bits.

6. The refresh counter of claim 2 wherein the means for receiving and controlling comprises a decoder and transfer devices.

7. The refresh counter of claim 6 wherein the transfer devices are single MOSFETs enabled by the decoder output.

8. The refresh counter of claim 2 wherein the refresh storage is a cross-coupled pair of MOSFETs with common sources and drains tied to each other's gates.

9. The refresh counter of claim 9 wherein the decoder is an AND-gate.

10. A refresh counter for sequencing a plurality of address bits comprising;

a plurality of address buffers each for receiving one of the address bits;

an address buffer strobe applied to each address buffer to sample the input of the address buffers;

a refresh storage for each address buffer output;

a transfer clock signal; and means for each address buffer for receiving the transfer clock signal and selected address bits and controlling the transfer of the inverted output of the address buffer to the refresh storage.

11. An n-bit address refresh counter comprising:

an address buffer for each address bit;

an address buffer strobe applied to each address buffer to sample the input of the address buffer and generate high level true and complement representations;

a refresh address storage for each address buffer for storing the true and complement representations are to be read by the address buffer;

a transfer clock signal;

n−1 decoders for n−1 buffers wherein the ith decoder receives the transfer clock signal and i address bits where i=1, 2, ... n−1 and generates an enabling signal when the transfer clock signal and all of the i address bits are true; and transfer devices associated with each decoder for receiving the enabling signal and transferring inverted true and complement representations of the ith buffer to its refresh address storage.

12. The refresh counter of claim 11 wherein the refresh storage is a cross-coupled pair of MOSFETs with common sources and drains tied to each other's gates.

13. The refresh counter of claim 11 wherein the transfer devices are single MOSFETs enabled by the decoder output.

14. The refresh counter of claim 1 wherein the decoder is an AND-gate.

15. A refresh counter comprising:

a plurality of address buffers for receiving address bits and generating high level true and complement representations; and means for inverting the true and complement representations, upon receiving an enabling signal, when selected address bits are true.

16. An n-bit address refresh counter comprising:

an address buffer for each address bit;

an address buffer strobe applied to each address buffer to sample the input of the address buffer and generate high level true and complement representations;

a cross-coupled pair of MOSFETs with grounded sources and drains tied to each other's gates for each address buffer whereby the true and complement representations are stored to be read by the address buffer;

a transfer clock signal;

n−1 AND gates for n−1 buffers wherein the ith AND gate receives the transfer clock signal and i address bits where i=1, 2, ..., n−1; and, MOSFETs for transferring the inverted true and complement representations of the ith buffer to the drain of the cross-coupled pair of MOSFETs and gated by the output of the AND gate.

* * * * *